(12) United States Patent
Maleville

(10) Patent No.: US 8,058,149 B2
(45) Date of Patent: Nov. 15, 2011

(54) METHOD FOR FABRICATING A SEMICONDUCTOR SUBSTRATE

(75) Inventor: Christophe Maleville, La Terrasse (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 2 days.

(21) Appl. No.: 12/815,262

(22) Filed: Jun. 14, 2010

(65) Prior Publication Data

US 2011/0034006 A1 Feb. 10, 2011

(30) Foreign Application Priority Data

Aug. 4, 2009 (EP) .................................... 09290609

(51) Int. Cl.
*H01L 21/46* (2006.01)
(52) U.S. Cl. ................. 438/458; 438/149; 257/E21.088
(58) Field of Classification Search .................. 438/149, 438/458
See application file for complete search history.

(56) References Cited

U.S. PATENT DOCUMENTS

| | | | | |
|---|---|---|---|---|
| 5,137,837 | A | 8/1992 | Chang et al. ..................... | 437/21 |
| 6,326,280 | B1 | 12/2001 | Tayanaka ..................... | 438/409 |
| 6,426,274 | B1 | 7/2002 | Tayanaka ..................... | 438/458 |
| 6,613,638 | B2 | 9/2003 | Ito ................................. | 438/311 |
| 7,446,018 | B2 * | 11/2008 | Brogan et al. ................. | 438/459 |
| 7,955,940 | B2 * | 6/2011 | Dyer et al. ..................... | 438/370 |
| 7,981,754 | B2 * | 7/2011 | Katou ............................ | 438/311 |
| 2005/0233493 | A1 | 10/2005 | Augusto ......................... | 438/51 |
| 2007/0023772 | A1 * | 2/2007 | Watanabe et al. ............... | 257/94 |
| 2007/0048971 | A1 * | 3/2007 | Endo et al. ..................... | 438/459 |
| 2009/0045470 | A1 * | 2/2009 | Kondo et al. .................. | 257/408 |
| 2009/0053875 | A1 | 2/2009 | Kim et al. ...................... | 438/458 |
| 2009/0098709 | A1 | 4/2009 | Phnuma et al. ................ | 438/458 |
| 2009/0170287 | A1 * | 7/2009 | Endo et al. ..................... | 438/458 |
| 2009/0246937 | A1 * | 10/2009 | Yamazaki et al. ............. | 438/458 |
| 2010/0090303 | A1 * | 4/2010 | Takizawa ....................... | 257/432 |
| 2011/0020976 | A1 * | 1/2011 | Watai et al. ..................... | 438/72 |

FOREIGN PATENT DOCUMENTS

| | | |
|---|---|---|
| EP | 0 676 796 A2 | 10/1995 |
| EP | 1 193 749 A1 | 4/2002 |
| EP | 1667 207 A1 | 6/2006 |
| EP | 2 028 685 A1 | 2/2009 |

OTHER PUBLICATIONS

European Search Report, application No. EP 09290609, dated Jan. 28, 2010.

* cited by examiner

*Primary Examiner* — Alexander Ghyka
(74) *Attorney, Agent, or Firm* — Winston & Strawn LLP

(57) ABSTRACT

A method for fabricating a semiconductor on insulator substrate by providing a first semiconductor substrate with a first impurity density of a first impurity type, subjecting the first semiconductor substrate to a first thermal treatment to thereby reduce the first impurity density in a modified layer adjacent a surface of the first semiconductor substrate being treated, transferring at least partially the modified layer with the reduced first impurity density onto a second substrate, to thereby obtain a modified second substrate, and providing a further layer on a transferred layer of the modified second substrate with the further layer having a second impurity density of a second impurity type that is different than the first impurity type of the transferred modified layer. By doing so, a contamination by dopants of the second impurity type of a fabrication line using semiconductor material with dopants of the first impurity type, can be prevented.

17 Claims, 2 Drawing Sheets

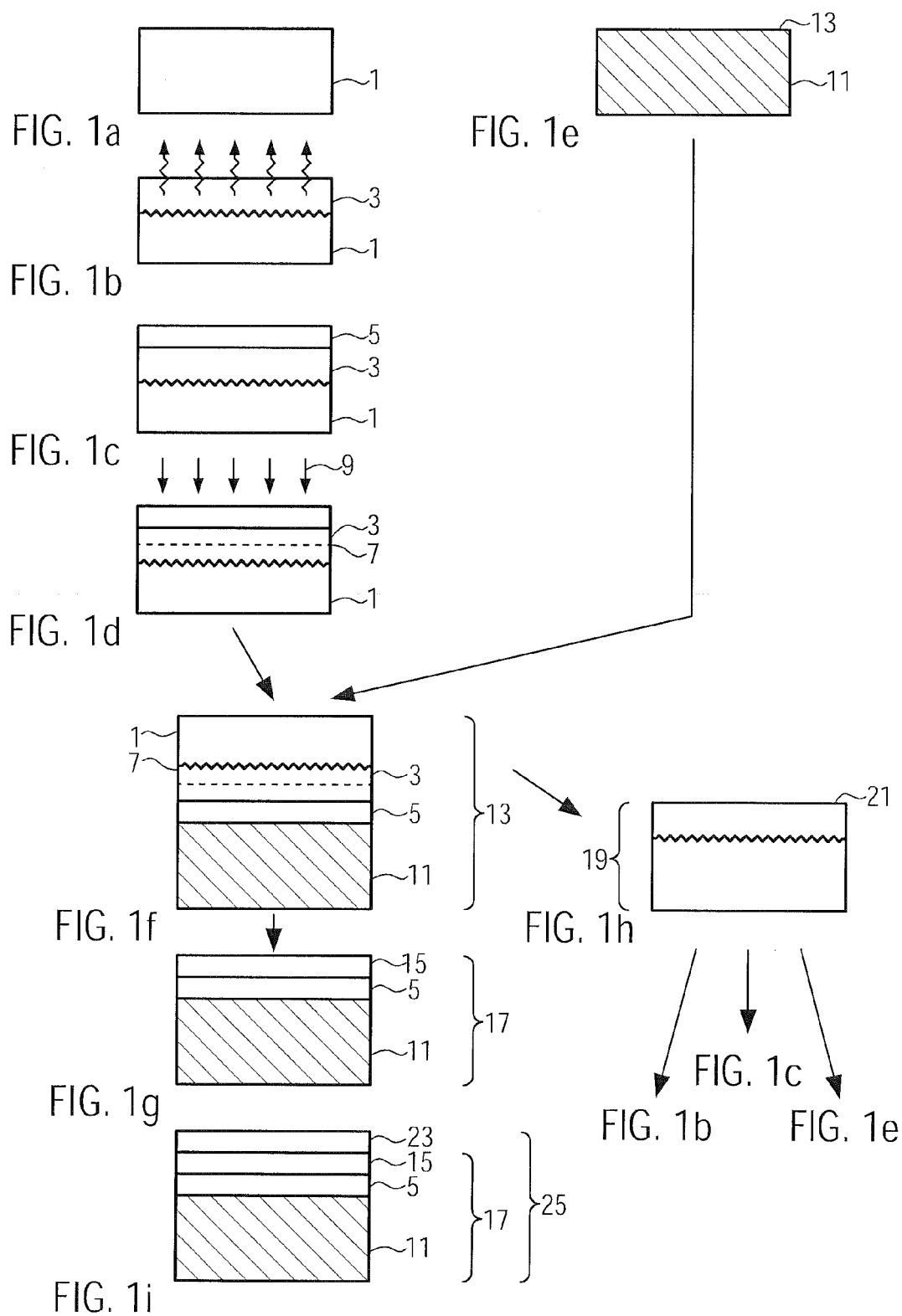

METHOD FOR FABRICATING A SEMICONDUCTOR SUBSTRATE

BACKGROUND

This invention relates to a method for fabricating a semiconductor substrate, in particular, to a semiconductor on insulator substrate (SOI) comprising an additional doped layer, in particular an epitaxial layer, suitable for opto electronic applications, such as image sensors.

In optoelectronics, special substrates are necessary which are, for example, used for image sensors, such as backside illuminated CMOS Image Sensors (BCIS), which find their application in video or photographic cameras. In these substrates, photons can be collected by the image sensors formed in the device layer of an SOI substrate. In some devices, the SOI device layer containing the image sensors is transferred to a final substrate to expose the backside of the sensors and facilitate the efficient collection of photons.

In the prior art, this kind of special SOI substrate was prepared using an n-type donor substrate, to form an n-type SOI layer by the conventional SMARTCUT™ layer transfer technology. This method typically comprises the steps of providing a donor substrate, e.g. a silicon wafer, providing an insulating layer on the donor substrate and creating a predetermined splitting area inside the donor substrate. The splitting layer is generally achieved by implanting atomic species or ions, such as helium or hydrogen ions, or both ions, into the donor substrate. In the next step, the donor substrate is bonded to a base substrate, e.g., a further silicon wafer, such that the insulating layer is sandwiched between the handle and the donor substrate. Subsequently, the remainder of the donor substrate is detached from the bonded donor-base substrate at the predetermined splitting area following a thermal and/or mechanical treatment upon the predetermined splitting area. As a result, a semiconductor on insulator (SOI) substrate is obtained.

The use of different dopants in a substrate can lead to cross-contamination of the dopants. For example, the use of a substrate having a first type of dopants (e.g. n-type) in an SOI substrate fabrication line, wherein the substrate has encounters a different substrate containing a second type of dopants (e.g. p-type), can lead to cross-contamination from donor wafers with an impurity dopant concentration of the second type used in the standard SOI substrate, to other wafers having the target dopant type of the first type. Even worse, in the case of special substrates for opto-electronic applications that need a different type of dopants e.g. n-type dopants (phosphorous) compared to standard substrates, e.g., p-type (boron), the n-type dopants may contaminate the fabrication line, thereby reducing the quality of the standard SOI substrates. This thus leads to unsatisfying dopant profiles in both the n-type SOI wafers and the standard p-type SOI wafers.

Surface contamination through airborne contamination is a key concern in this matter. In a standard cleanroom environment with no specific chemical filtering, it is common to have boron or phosphorus contamination on surfaces, in the range of 1 to several $10^{12}$ at/cm$^2$ for about 30 min to 2 hours, depending on the air recycling rate. By diffusion, these unwanted elements diffuse into the bulk of a substrate leading to a volume contamination in the of order of $10^{16}$ at/cm$^3$, which is a particular problem when n- or p-type layers are targeted.

In addition, during subsequent annealing steps during the typical SMARTCUT™ process, a diffusion of dopants out of the counter-doped layer occurs which further deteriorates the substrate.

Furthermore, special substrates with n-type dopants show a rather high density of defects compared to special substrates with a p-type dopant structure. This is related to the fact that n-type starting substrates, on which an additional epitaxial layer will be grown, have a lower quality than p-type substrates, in particular concerning COP defects.

Thus, there is a need for improvements in these type constructions so that improved BCIS devices can be prepared. The present invention now satisfies this need.

SUMMARY OF THE INVENTION

The invention thus relates to a method for fabricating a semiconductor on insulator substrate by providing a first semiconductor substrate with a first impurity density of a first impurity type, subjecting the first semiconductor substrate to a first thermal treatment to thereby reduce the first impurity density in a modified layer adjacent a surface of the first semiconductor substrate being treated, transferring at least partially the modified layer with the reduced first impurity density onto a second substrate, to thereby obtain a modified second substrate, and providing a further layer on a transferred layer of the modified second substrate with the further layer having a second impurity density of a second impurity type that is different than the first impurity type of the transferred modified layer. By doing so, a contamination by dopants of the second impurity type of a fabrication line using semiconductor material with dopants of the first impurity type, can be prevented. Thus, cross-contamination of dopants between the substrates is avoided.

BRIEF DESCRIPTION OF THE DRAWINGS

In the following, an advantageous embodiment of the invention will be described in relation to the enclosed Figures.

FIGS. 1a-1i illustrate a method embodiment of the method according to the invention.

DETAILED DESCRIPTION OF THE INVENTION

Figure 2A:
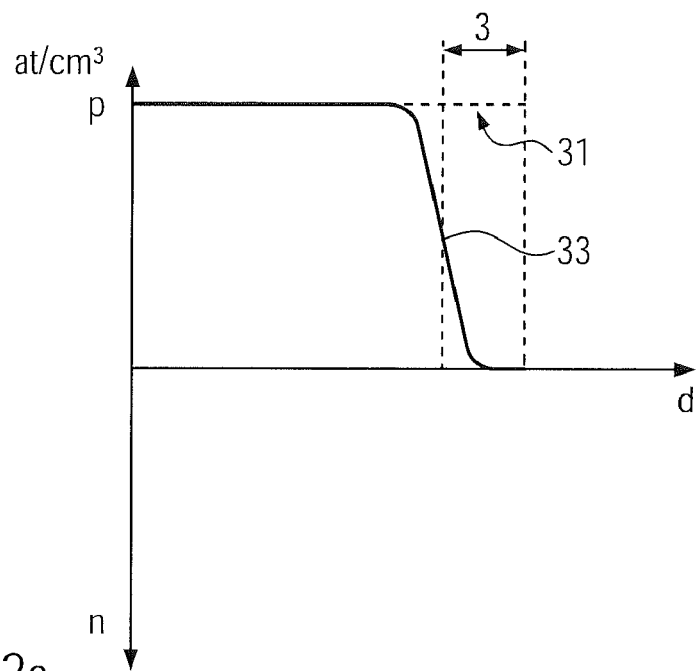
FIGS. 2a and 2b illustrate the dopant profile of a first substrate and the one achieved for the semiconductor on insulator substrate with the additional layer fabricated according to the invention.

The present invention now provides a method for fabricating a semiconductor on insulator substrate with an additional layer with which the cross-contamination problems of n- and p-type doped layers can be overcome.

This method preferably comprises the steps of: a) providing a first semiconductor substrate with a first impurity density of a first impurity type, b) subjecting the first semiconductor substrate to a first thermal treatment to thereby reduce the first impurity density in a modified layer adjacent one main surface of the first semiconductor substrate, c) transferring at least partially the modified layer with the reduced first impurity density onto a second substrate, to thereby obtain a modified second substrate, and d) providing a layer, in particular by epitaxial growth, with a second impurity density of a second impurity type different to the first impurity type.

By providing a starting substrate having a different impurity type than the final substrate, one can use the same fabrication line to transfer a layer from the first to the second substrate without risking contamination even in case the final substrate has impurities of a different kind compared to the substrates that are usually fabricated on that same fabrication line.

Furthermore one can choose the substrate with the better qualities as a starting material independently of the final impurity type.

As described herein, the term "impurity type" relates to n- or p-type impurities. Here, the atoms of the second impurity type can either be provided directly during the growth of the additional layer or afterwards.

Preferably, step d) is carried out such that the transferred layer has a third impurity density of the second impurity type. This is either achieved by diffusion, thus unintentionally, or by auto-doping, thus an intentional process. Thus the transferred layer changes its impurity type during the process and it becomes possible to tailor the final dopant profile to the needs of the desired application.

Advantageously, the method can further comprise an additional step e) of subjecting the modified second semiconductor substrate to a second thermal treatment after step c) and before step d). This will further reduce the dopant concentration of the first impurity type in the transferred layer. Thus, even if, during the transfer process, a recontamination of the layer close to the surface of the first substrate occurs, these contaminants can diffuse out during the second thermal treatment before the provision of the layer with the second impurity density.

Preferably, step c) can comprise the sub-steps of: f) creating a predetermined splitting area inside the semiconductor substrate, preferably inside the modified layer with the reduced impurity density, g) attaching, preferably by bonding, the first semiconductor substrate to the second semiconductor substrate to sandwich the reduced first impurity density layer therebetween and h) subjecting the bonded substrate to a thermal and/or mechanical treatment such that detachment occurs at the predetermined splitting area. Thus, a SMARTCUT™ type layer transfer process can be carried out without risking the contamination of the layer transfer fabrication line, in case substrates with the second impurity type have to be fabricated in a line usually only used for the first impurity type.

According to a preferred embodiment, the method can comprise a further step of providing a dielectric layer on the modified layer with reduced impurity density. This layer can be provided by thermal growth or deposition. As an alternative, the dielectric layer may be provided on the second substrate before the layer transfer. Thus the method is compatible with a standard SMARTCUT™ technique, as described herein.

According to a preferred embodiment, the remaining part of the first semiconductor substrate obtained during step c) can be reused as a new first semiconductor substrate in a subsequent semiconductor substrate fabricating process comprising at least steps c) and d). Even more preferred, step b) can be carried out such that steps c) and d) can be carried out at least two times without repeating step b). In fact, by carrying out the first thermal treatment such that the modified layer adjacent has a thickness being at least twice the thickness of the transferred layer, it becomes possible to transfer two layers without having to carry out the impurity density reduction step b). This further optimizes the process.

According to a variant, the remaining part of the first semiconductor substrate obtained during step c) can instead be reused as a new second semiconductor substrate in a subsequent semiconductor substrate fabricating process comprising at least steps c) and d). Thus, in this case, the remainder obtained during step c), can still be reused even in case it cannot be reused as a donor substrate again, so that no material is spoiled or discarded.

Preferably, the first and second thermal treatments can be carried out under a neutral atmosphere in particular an atmosphere of helium, argon or helium and argon. Under these process conditions, the diffusion of the unwanted dopants out of the substrate can be optimized. Furthermore, a surface cleaning effect occurs during the thermal treatments.

Advantageously, the first impurity type can be a p-type impurity and the second impurity type an n-type impurity. The n-type semiconductor on insulator layer substrate plays an important role in opto-electronic applications, but starting substrates of the n-type have a lower quality, in particular concerning COP defects, than corresponding p-type substrates. With the method according to the invention, it is thus possible to obtain a desired substrate with improved properties concerning defect density.

Preferably, the first semiconductor substrate is one of a silicon, germanium, gallium, arsenide, or SIC. Advantageously, the second substrate can be one of silicon, germanium, gallium arsenide, quartz, or SiC. Preferably the second substrate comprises a dielectric layer on one of its main surfaces.

Advantageously, the first impurity density can be in the range of $0.5*10^{16}$ to $5*10^{16}$ atoms/cm$^3$ and the second impurity density and the third impurity density are of the same order, in particular in the range of $0.5*10^{14}$ to $5*10^{14}$ atoms/cm$^3$. Thus, with this method starting for instance with a p substrate, a final dopant concentration of the n-type can be obtained in the final substrate. This is a significant improvement over the art.

According to a variant, at least one further layer can be grown on the layer provided during step d) with a fourth impurity density, in particular of the first impurity type. Thus, a layer structure with a dopant concentration of the p++ type (impurity concentration of the order of $10^{18}$) can be provided on the n-layer, which could be used to prepare substrates for generating improved CIS image sensors.

According to step a) of the inventive method (as illustrated in FIG. 1a), a first semiconductor substrate 1 with a first impurity density of a first impurity type is provided. This substrate can be a silicon, germanium, gallium arsenide or SiC wafer, e.g., in a wafer size of 200 mm or 300 mm. According to a variant, the semiconductor substrate could also be a base substrate of any material with a semiconductor layer provided thereon.

In this embodiment, the semiconductor substrate 1 is a lowly doped substrate, typically with a dopant concentration or impurity density in the order of $0.5*10^{16}$ to $5*10^{16}$ atoms/cm$^3$. Here, the semiconductor substrate 1 is a p-type impurity doped silicon substrate, for instance using boron as an impurity atom. P-type substrates have the advantage that they have good crystalline properties and, in particular, can be provided COP defect free.

FIG. 1b illustrates step b) of the inventive method. This step consists in providing a thermal treatment of the semiconductor substrate 1 to reduce the first impurity density in a modified layer 3 adjacent to one main surface of the first semiconductor substrate 1. The thermal treatment is carried out under a neutral atmosphere, for instance under helium, argon or mixtures thereof, such that the impurity atoms can diffuse out of the substrate as illustrated by the arrows in FIG. 1b. Depending on the conditions of the thermal treatment step, the temperature can go up to 1200° C., with a duration of the treatment of up to several hours, until a depleted layer 3 of a thickness in a range of about 100 nm to 300 nm is achieved.

FIG. 2a schematically illustrates the dopant concentration profile achieved for the structure illustrated in FIG. 1b. Before the thermal treatment, the substrate 1 has a flat p-type dopant profile as illustrated by the dotted line 31. After the thermal treatment, the dopant concentration 33 illustrated by a plain line is achieved. Close to the surface of the substrate 1, a depleted region can be observed which defines the modified layer 3. This layer typically has a thickness of 100 nm to 300 nm depending on the thermal budget that is applied.

Subsequently, as illustrated in FIG. 1c, a dielectric layer 5, for instance silicon dioxide in the case of a silicon semiconductor substrate 1, is provided on the semiconductor substrate 1. This layer can be achieved by thermal oxidation or deposition. The silicon oxide layer 5 typically has a thickness of 200 nm to 400 nm, but an ultra thin oxide layer of about 10 nm or a composite dielectric layer with a nitride and an oxide can also be considered. Thus, various thicknesses of oxide and nitride materials from 10 nm to 400 nm can be provided in this layer depending upon the particular processing conditions.

Subsequently, as illustrated in FIG. 1d, a predetermined splitting area 7 is formed inside the modified layer 3 with the reduced impurity density. The predetermined splitting area 7 can be achieved by implanting atomic species or ions 9 through the dielectric layer 5. Preferably, helium or hydrogen ions, of a coimplantation of helium and hydrogen ions as is known in the SMARTCUT™ layer transfer technology can be used.

Furthermore, a second substrate 11, for instance a silicon wafer, a germanium wafer, a gallium arsenide, a SiC wafer or a transparent substrate such as a quartz or glass substrate, with or without an additional dielectric layer (not shown but mentioned above) on its surface 13 can be provided (see FIG. 1e). The second substrate 11, can also be a p-type or n-type doped substrate.

The next step, illustrated in FIG. 1f, comprises attaching, preferably by molecular bonding, the first semiconductor substrate 1 to the second substrate 11 such that the dielectric layer 5 and the modified layer 3 are sandwiched between the substrates 1 and 11. If desired, the surfaces to be bonded can be planarized to facilitate bonding. By subjecting the bonded structure 13 to a thermal and/or mechanical treatment, for instance a thermal anneal at a temperature of about 500-600° C., detachment occurs at the predetermined splitting area 7 and thereby, at least a part 15 of the modified layer 3 together with the dielectric 5, is transferred onto the second substrate 11. This modified second substrate 17 is illustrated in FIG. 1g and the remainder 19 of the first semiconductor substrate 1 is illustrated in FIG. 1h. As the predetermined splitting area 7 was inside the modified layer 3, the remainder 19 still comprises a remaining part 21 of the modified layer 3 with the reduced first impurity density.

The remaining part 19 of the first semiconductor substrate 1 can be recycled, for instance after a cleaning or a polishing step and then be reused either as a new first substrate or as a second substrate. Depending on the thickness of the remaining part 21 of the modified layer with reduced impurity density, the recycled substrate 19 may not be subjected to the thermal treatment illustrated in FIG. 1b again, but the subsequent fabrication run will directly start with the step of providing a dielectric layer 5 on the layer 19/3 as illustrated in FIG. 1c. In case the thickness of layer 19 is not sufficient for a new fabrication run, the subsequent run will start with the thermal treatment step of the process as illustrated in FIG. 1b. By doing so, not only the use of the semiconductor material is optimized by reusing one donor substrate for a plurality of fabrication runs, but also the amount of process steps can be optimized. Indeed, one thermal treatment step to reduce the impurity density in the first semiconductor substrate 1 can thus be sufficient for a plurality of fabrication sequences as illustrated in FIG. 1.

As illustrated in FIG. 1i, a further layer 23 is then provided on the transferred layer 15 of the modified second substrate 17 according to step d) of claim 1. This layer 23 is either heteroor homoepitaxially, but preferably homoepitaxially grown on the transferred layer 15. Its thickness can be as desired but is typically of the order of 1 to 6 µm.

During growth of the epitaxial layer 23, it can be subjected to a dopant treatment using n-type impurity atoms, for instance phosphorous atoms, thus of the opposite type compared to the first substrate 1. By diffusion or auto-doping, the transferred layer 15 will also become doped by the second impurity type. According to a variant, the dopant treatment could also be carried out after the growth of the epitaxial layer 23 but it is more economical and efficient to conduct the doping or autordiffusion during the epitaxial growth step. Preferably, the growth and doping step are carried out in one and the same tool, for instance an epi-reactor, thus providing further economies and efficiencies.

Figure 2B:
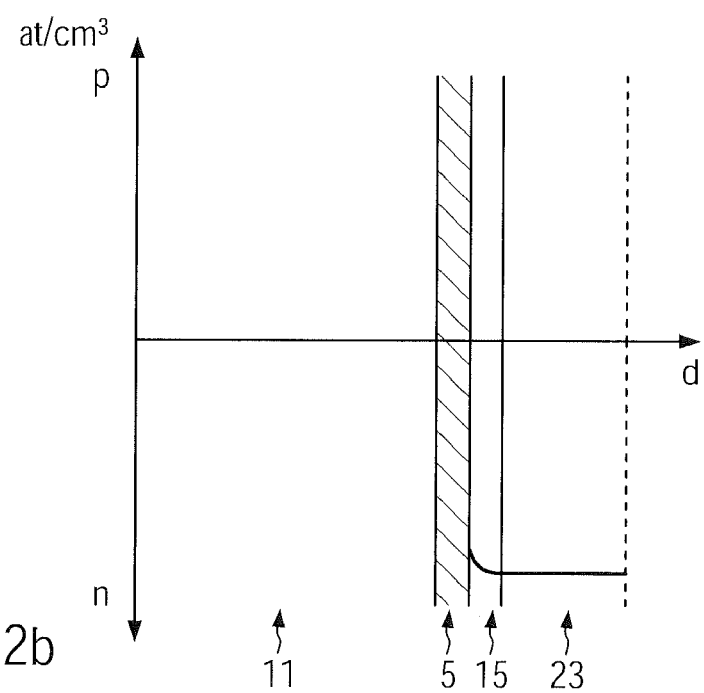

FIG. 2b schematically illustrates the corresponding dopant profile of the final substrate 25. The second substrate can have any dopant structure, e.g., n or p, but is preferably not doped. Furthermore, the buried oxide layer 5, is also not doped. Due to the auto-doping or diffusion effects, an n-type dopant concentration of about $10^{14}$ at/cm$^3$ is observed in the transferred layer 15. Thus, the previously p-type doped layer now has an n-type doping property. Finally layer 23 also has a dopant concentration of about $10^{14}$ at/cm$^3$ and remains n-type.

According to a variant of the inventive embodiment, an additional thermal treatment step can be carried out between the steps illustrated in FIGS. 1g and 1i to further reduce the p-type dopant concentration in the transferred layer 15. Again, this thermal treatment is carried out under a neutral atmosphere, for instance helium or argon.

Without departing from the scope of the invention, instead of starting with a p-type substrate 1 to finally achieve an n-type doped final substrate 25, one can of course also start with an n-type starting material to achieve a final p-type substrate comprising the epitaxial layer.

According to a further variant of the inventive embodiment which can be combined with any embodiment or variant alone or in combination, at least one further layer is grown on the layer 23 with a fourth impurity density. The fourth impurity density can, for instance, be of a p++ type, thus with an impurity concentration of the order of $10^{18}$ at/cm$^3$. Thus, a substrate like needed in optoelectronic applications, such as in a BCIS image sensor, can be formed.

With this method, it is possible to prevent contamination of a SMARTCUT™ p-type fabrication line by n-type dopants (phosphorous) and, at the same time, high quality n-type SOI substrates with an epitaxial layer for use in opto-electronics (BISC substrates) can be achieved, as one starts with the better quality p-type substrates.

What is claimed is:

1. A method for fabricating a semiconductor substrate having improved dopant layers, which comprises:
providing a first semiconductor substrate with a first impurity density of a first impurity type,
subjecting the first semiconductor substrate to a first thermal treatment to thereby reduce the first impurity density in a modified layer adjacent a surface of the first semiconductor substrate being treated,
transferring at least partially the modified layer with the reduced first impurity density onto a second substrate, to thereby obtain a modified second substrate, and
providing a further layer on a transferred layer of the modified second substrate with the further layer having a second impurity density of a second impurity type that is different than the first impurity type of the transferred modified layer wherein dopant cross-contamination between substrates is avoided.

2. The method of claim 1, wherein the semiconductor substrate that is fabricated is a silicon on insulator (SOI) substrate and the further layer is provided upon the transferred layer by epitaxial growth.

3. The method of claim 1, which further comprises an subjecting the modified second substrate to a second thermal treatment before providing the further layer.

4. The method of claim 1, wherein the transferring comprises:

creating a predetermined splitting area inside the first semiconductor substrate, attaching the first semiconductor substrate to the second semiconductor substrate to sandwich the reduced first impurity density layer therebetween, and subjecting the bonded structure to a thermal or mechanical treatment such that detachment occurs at the predetermined splitting area.

5. The method of claim 4, wherein the predetermined splitting area is provided inside of the modified layer with the reduced impurity density, and the substrates are attached by molecular bonding.

6. The method of claim 1, which further comprises providing a dielectric layer on the modified layer with reduced impurity density.

7. The method of claim 1, wherein the remaining part of the first semiconductor substrate remaining after transfer of the modified layer is reused as a new first semiconductor substrate in a subsequent semiconductor substrate fabricating process which comprises:

transferring a further part of the modified layer with the reduced first impurity density onto a second substrate, to thereby obtain a modified second substrate, and providing a further layer on a transferred layer of the modified second substrate with the further layer having a second impurity density of a second impurity type that is different than the first impurity type of the transferred modified layer.

8. The method of claim 7, wherein the first thermal treatment is carried out on the first semiconductor structure is such that the further transferring and providing steps can be carried out at least two times without repeating the first thermal treatment.

9. The method of claim 1, wherein the remaining part of the first semiconductor substrate remaining after transfer of the modified layer is reused as a new semiconductor substrate in a subsequent semiconductor substrate fabricating process which comprises:

transferring a further part of the modified layer with the reduced first impurity density onto a second substrate, to thereby obtain a modified second substrate, and providing a further layer on a transferred layer of the modified second substrate with the further layer having a second impurity density of a second impurity type that is different than the first impurity type of the transferred modified layer.

10. The method of claim 1, wherein the first impurity type is a p-type impurity and the second impurity type is an n-type impurity.

11. The method of claim 1, wherein the first semiconductor substrate is one of a Si, Ge, GaAs, or SiC substrate.

12. The method of claim 1, wherein the second substrate is one of Si, Ge, GaAs, quartz, or SiC.

13. The method of claim 12, wherein the second substrate includes a dielectric layer on one of its main surfaces.

14. The method of claim 1, wherein the providing of the further layer is carried out such that the transferred modified layer has a third impurity density of the second impurity type.

15. The method of claim 14, wherein the third impurity density is achieved by one of diffusion or by auto-doping.

16. The method of claim 14, wherein the first impurity density is in the range of $0.5*10^{16}$ to $5*10^{16}$ atoms/cm$^3$, and the second impurity density and the third impurity density are of the same order in the range of $0.5*10^{14}$ to $5*10^{14}$ atoms/cm$^3$.

17. The method of claim 14, which further comprises providing at least one additional layer with a fourth impurity density on the layer with the third impurity density.

* * * * *